United States Patent [19]

Kajiwara et al.

[11] Patent Number: 5,114,543

[45] Date of Patent: May 19, 1992

[54] METHOD OF MAKING THIN COPPER FOIL FOR PRINTED WIRING BOARD

[75] Inventors: Toshiyuki Kajiwara; Yoshinori Tanii; Kazuhiko Hashimoto, all of Kyoto, Japan

[73] Assignee: Fukuda Kinoku Hakafun Kogyo Kabushiki Kaisha, Kyoto, Japan

[21] Appl. No.: 670,812

[22] Filed: Mar. 18, 1991

Related U.S. Application Data

[62] Division of Ser. No. 524,755, May 17, 1990.

[30] Foreign Application Priority Data

May 17, 1989 [JP] Japan .................................. 1-123496
Oct. 12, 1989 [JP] Japan .................................. 1-265680

[51] Int. Cl.$^5$ .......................... C25D 3/58; C25D 7/06
[52] U.S. Cl. ...................................... 205/152; 205/187
[58] Field of Search ............................ 204/27, 40, 44

[56] References Cited

U.S. PATENT DOCUMENTS 4,131,517 12/1978 Mitsuo .................................. 204/27
5,019,222 5/1991 Hino .................................... 204/27

FOREIGN PATENT DOCUMENTS 20347 2/1982 Japan .

Primary Examiner—T. M. Tufariello
Attorney, Agent, or Firm—Lowe, Price, LeBlanc & Becker

[57] ABSTRACT

A thin copper foil for a printed wiring board comprising a copper foil supporter having a rough surface on at least a side thereof, a parting layer laid on the side of the rough surface, a thin copper foil layer laid on the parting layer, and a copper-nickel compound metal layer interposed between the parting layer and the thin copper foil layer, and a method of manufacturing thereof.

2 Claims, 1 Drawing Sheet

METHOD OF MAKING THIN COPPER FOIL FOR PRINTED WIRING BOARD

This application is a division of application Ser. No. 07/524,755 filed May 17, 1990.

BACKGROUND OF THE INVENTION (1) Field of the Invention

The present invention relates to a thin copper foil for a printed wiring board and a method of manufacturing the same and more particularly to the thin copper foil with a peelable copper foil supporter, which has stabilized a strength between the supporter and the thin copper foil having a thickness less than 12 μm.

(2) Description of the Prior Art

Recently, circuits in a printed wiring board assembled in electronic machines are going to high density and electric conductors of the circuits tend to be extremely fine according to rapid progress of miniaturization of the electronic machines.

To fulfil these requirements, it is common to use a thin copper foil having a thickness of less than 12 μm wherein side etching seldom occurs. Since these thin copper foils are weak, it is difficult to use them as they are easily creased or torn in handling. Therefore, as a copper foil for an outer layer of a multilayer printed wiring board, a thin copper foil with a supporter is used, including an aluminium foil or a copper foil. A thin copper foil layer is electrically deposited on one side of the supporter, this thin layer having a thickness of less than 12 μm.

As an example, it has been proposed to use a supporter which is prepared by depositing a chrome metal on a surface of a side of an electrolytic copper foil by means of chrome plating or the like. A thin copper foil layer is then deposited on the chrome metal so as to make a thin copper foil with a peelable deposited copper foil supporter (See Japanese patent publication Sho. 53-18329).

To make a multilayer board by using the tin copper foil with the supporter, it was carried out through such steps as shown in FIG. 2.

First, a prepreg comprising glass and epoxy was laid on both sides of a printed wiring board for inner layer and a copper foil with a supporter is laid on the outer side of the prepreg to face the copper foil supporter outwardly and then these were laminated one another under high pressure and temperature. The finished multilayer board were drilled at desired positions thereof and then the copper foil supporter was peeled off mechanically. Thereafter, in order to form an electric conductor in each of the drilled holes, electroless plating was applied thereto after a step of pretreatment. Next, the portions of the board except the circuit portions to be necessitated were covered with a photoresist. A thin copper plating was given to the circuit portions and the electric conductor in the hole using a copper electroplating bath for through-holes and soldering was carried out thereon and thereafter the photoresist was removed. Finally, the laminated board was etched with an etching liquid of alkaline ammonia using a quick etching method so as to produce a multilayer printed wiring board.

However, there remained some troubles when producing the thin copper foil with the supporter and also when producing a multilayer board by using same.

For instance, since a peel strength between the copper foil supporter and the thin copper foil layer, was dispersed widely and therefore the following troubles occurred to the thin copper foil with the supporter.

Where the peel strength was too weak, there were the following drawbacks.

① When the thin copper foil with the supporter was laminated with the prepreg under high pressure and temperature and at the time of taking out its laminated board from a press machine or at the time of cutting same in a desired size, the copper foil supporter was peeled off naturally and therefore there was the danger that the thin copper foil layer on the surface of the laminated board would be damaged during handling of the laminated board.

② In the process of drilling the laminated board, when a drill was withdrawn from the drilled hole, the copper foil supporter was peeled off and lifted from the board. As the result, the drilling process could not be continued.

Conversely, when the peel strength of the supporter was too strong, there were the following disadvantages.

③ After drilling, when the supporter was peeled off from the board mechanically, a part of the thin copper foil layer was damaged or broken at an end thereof located around the holes.

④ Particularly, in a case of a large laminated board a large force is required to peel the supporter off from the board.

⑤ A part of the chrome plating layer was left on the surface of the thin copper foil layer after peeling off the supporter, and as the result desired conductive circuits cannot be obtained.

⑥ The copper foil supporter of chrome plating, which was peeled off from the laminated board, contains a large amount of chrome and therefore cannot be reused as copper materials or disposed as a scrap.

⑦ To produce or manufacture the thin copper foil with the supporter, it is conventional to use a chrome plating bath of strong acid including a high concentration of hexavalent chromium ions. Use of such a bath is expensive in consideration of steps necessary to dispose of the plating waste fluid.

Further, since the plating liquid was electrolyzed with high current density, it produces a large amount of hazardous mist.

Namely, through examination of the above mentioned disadvantages in connection with the use of conventional copper foil with a supporter, the inventors have found that there occurs dispersion of a peel strength between the parting layer and the thin copper foil layer when the supporter is peeled off from the thin copper foil. This dispersion originates in the connection between the parting layer which is formed by means of chrome plating and the thin copper foil layer which is formed by means of copper plating.

The inventors have determined that the dispersion problem may be solved by interposing between the above mentioned layers a suitable intermediate layer connectable thereto. We have researched the composition of the intermediate layer in various ways and found that the dispersion of a peel strength can be controlled by forming a copper-nickel compound metal.

SUMMARY OF THE INVENTION

It is an object of the present invention to provide a thin copper foil for a printed wiring board and a method of manufacturing same which can stabilize a peel strength between a thin copper foil layer and a copper foil supporter at a practically suitable level in order to solve any problems occurred in dispersion of a peel strength of the supporter.

The present invention has another object to reuse the copper foil supporter which is peeled off after lamination, by adopting a chromate treatment of low concentration for preparation of a parting layer, which treatment does not product a harmful mist, so that workers' health may be considered sufficiently.

To achieve the above objects, a thin copper foil for a printed wiring board according to the present invention comprises a copper foil supporter having a rough surface on at least a side thereof, a parting layer laid on the side of the rough surface, a thin copper foil layer laid on the parting layer, and a copper nickel compound metal layer interposed between the parting layer and the thin copper foil layer.

Further, a method manufacturing a thin copper foil for a printed wiring board according to the present invention comprises the steps of (a) preparing a copper foil supporter having a rough surface on at least a side thereof, (b) forming a parting layer on the rough surface of the copper foil supporter by immersing the rough surface in a chromate bath including hexavalent chromium ions and keeping a value of pH between 2.0 and 6.5, (c) forming a copper-nickel compound metal layer by immersing the parting layer in a compound metal plating bath including cupric ions, nickel ions and citric acid and keeping a value of pH more than 5.0 and by plating same by means of cathodic electrolysis, and (d) immersing the copper-nickel compound metal layer in an electric plating bath to deposit a thin copper foil layer.

Therefore, since the peel strength between the copper foil supporter and the thin copper foil layer is stabilized at a suitable value, the present invention has the following advantages.

① The supporter will not peel off while the thin copper foil with the supporter is laminated with the prepreg under high pressure and temperature.

② There is no danger of the supporter peeling off of the supporter while drilling so that drilling work is not interrupted.

③ At the time of peeling off the supporter after drilling, there is no danger of damaging the compound metal layer around the drilled holes.

④ The supporter may be manually peeled off from the laminated board even if the board is relatively large.

⑤ The metal such as chromium which is insoluble in a soft etching liquid does not remain on the compound metal layer after peeling off of the supporter.

⑥ The copper foil supporter peeled off may be reused as an electrolytic copper of high purity since it takes no account of a chrome compound remained on the copper foil supporter.

⑦ To form the parting layer, a chromate plating bath uses a weak acid including hexavalent chromium ions of low concentration. An immersing process is used to avoid production of a harmful mist. Therefore, there is a reduced personal hazard and the process is easily carried out to dispose of the waste fluid of the chromate bath.

Other objects and advantages of the present invention will be apparent from the description with reference to the drawings.

BRIEF DESCRIPTION OF THE DRAWINGS

The drawings show embodiments of a thin copper foil for a printed wiring board and a method of manufacturing same in which.

DETAILED DESCRIPTION OF THE EMBODIMENT

First Embodiment

As a supporter, an electrolytic copper foil was soaked in sulfuric acid of 5 weight % for 20 seconds and thereafter washed with a city water for 20 seconds. The electrolytic copper foil had a thickness of 70 $\mu$m and a rough surface on a side thereof which surface had a difference of 5 $\mu$m between absolute top and bottom of the rough. The supporter was soaked in a bath of chromate solution for 60 seconds which solution was prepared by dissolving sodium dichromate in a city water at a concentration of 20 g per liter (7.9 g per liter as hexavalent chromium ions), so as to form a parting layer thereon. The chromate bath had 4.1 pH and a temperature of 25° C. The supporter was washed with water for 20 seconds and thereafter immersed in a plating bath of copper and nickel compound metal as identified below, so as to form a copper-nickel layer of 1.0 $\mu$m in thickness on the rough surface thereof by means of cathodic electrolysis.

Copper sulfate ($5H_2O$): 0.08 mole/l
Nickel sulfate ($6H_2O$): 0.16 mole/l
Citric acid: 0.5 mole/l
pH: 5.2
Bath temperature: 40° C.
Current density of cathode: 3 A/dm$^2$
Time: 4 minutes Analysis of the compound metal deposited in this plating showed copper of 75 weight % and nickel of 25 weight %.

Then, the supporter was washed with a city water for 30 seconds and thereafter a thin copper foil layer of 5 $\mu$m was formed on the compound metal layer by utilizing a plating bath of copper-pyrophosphate, which is identified below.

Copper pyrophosphate: 80 g/l
Potassium pyrophosphate: 290 g/l
Ammonia water: 3 l/l
(Specific gravity: 0.85)

Copper plating bath had pH of 8.7 and a temperature of 57° C. and the plating was carried out with a current density of cathode of 4 A/dm$^2$ for 5 minutes and 38 seconds. Thereafter, the thin copper foil with the supporter was washed with a city water for 30 seconds and immediately dried by a hot air dryer.

Figure 1:
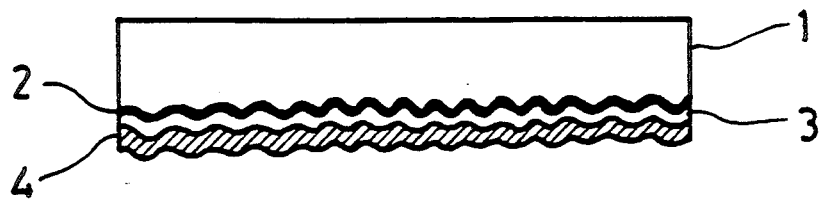
FIG. 1 is a sectional view of a thin copper foil with a supporter.
Figure 2:
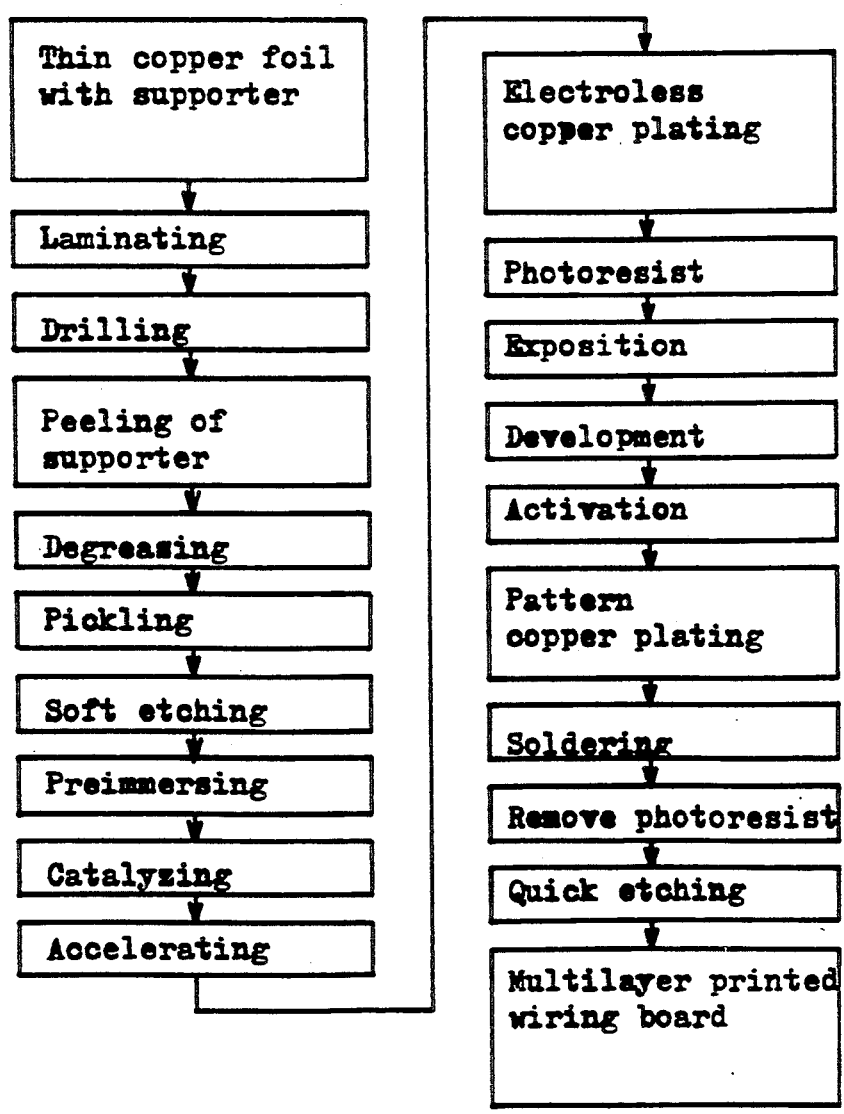
FIG. 2 is a diagram showing steps of manufacturing a multilayer printed wiring board by utilizing the copper foil with a supporter.

To make a multilayer printed wiring board, a glass-epoxy prepreg (NEMA grade FR-4) was laid on both sides of an inner layer panel or board and further the thin copper foil with the supporter was laid thereon in such a manner that the thin copper foil layer faced the prepreg, and thereafter laminated under the conditions of high pressure and temperature (at 165° C. under 50 kg/cm$^2$ for 60 minutes). Next, hole were formed in the laminated board by means of a drill having a diameter of 1 mm and then the copper foil supporter was peeled off from the laminated board. The peel strength of the supporter was 60 g/cm and its peeling was easily carried out by hand over the laminated board. Further, no partial separation was found on the compound metal layer around the drilled holes. To form an electric conductor in each of the holes of the laminated board, a tendency of soft-etching was checked by immersing in a aqueous solution in which ammonium persulfate was dissolved at a concentration of 100 g/l after degreasing the board and pickling same. As the result, the compound metal layer of a grayish white color on the surface of the board was completely dissolved and the thin pink copper foil appeared. Thereafter, predipping, catalyzing and accelerating treatments were applied to the board and electroless copper plating was carried out. Next, predetermined portions of the board other than required circuit rooting portions were covered with a photoresist. A thin copper plating was applied to the circuit portions and the electric conductor in the holes using a copper electroplating bath for through-holes and soldering was carried out thereon. Thereafter, the photoresist used was removed. Finally, the laminated board was etched with an etching liquid of alkaline ammonia in a manner of quick etching so as to make a multilayer board. The resulting structure is shown in FIG. 1. Copper foil supporter layer 1 has a surface roughness of 1 to 9 μm. Parting layer 2 includes chromatic compounds. Copper-nickel metal layer 3 has a thickness between 0.01 and 6 μm and thin copper foil 4 has a thickness of 1 to 9 μm.

The appraisal is shown in Table 1, which follows the end of description of the embodiments.

Second Embodiment

A rolled copper foil having a thickness of 70 μm was immersed in a aqueous solution of dissolved ammonium persulfate at a concentration of 100 g/l to roughen the surfaces of the foil.

With immersion the copper foil at a temperature of 40° C. for 60 seconds, the rough surface showed a roughness value of 1.0 μm as a difference between absolute top and bottom thereof.

The rolled copper foil having rough surfaces was washed with water for 45 seconds and then immersed in a chromate bath as identified below so as to form a parting layer on the rough surfaces.

Chromium trioxide: 1 g/l
Potassium dichromate: 3 g/l
pH: 2.2
Bath temperature: 25° C.
Immersing time: 60 seconds Thereafter, the foil was washed with water for 10 seconds and only a side thereof was immersed in a plating bath of copper-nickel compound as identified below and subjected to cathodic electrolysis so as to plate the foil with copper-nickel compound with a thickness of 1.0 μm.

Copper sulfate ($5H_2O$): 0.04 mole/l
Nickel sulfate ($6H_2O$): 0.15 mole/l
Citric acid: 0.4 mole/l A plating bath of the compound metal had a pH of 5.5. The plating was carried out at a bath temperature of 40° C. and with a current density of 3.0 A/dm$^2$ for 4 minutes. The compound metal layer contained a copper of 35 weight %. A supporter with the compound metal plating was washed with water and thereafter a thin copper foil layer was formed on the compound metal layer with a thickness of 5 μm using a plating bath of copper sulfate as identified below.

Copper sulfate (5H $_2$O): 240 g/l
Sulfuric acid: 70 g/l

The plating bath was maintained at a temperature of 40° C. and the plating was carried out with a cathodic current density of 3 A/dm$^2$ for four and a half minutes. Thereafter, to increase bonding strength with respect to a glass-epoxy prepreg, a copper dendrite was electrically deposited on the surface of the thin copper foil layer by using a rough treatment bath as identified below.

Copper sulfate ($5H_2O$): 120 g/l
Sulfuric acid: 60 g/l
Nitric acid: 20 g/l

The plating bath was maintained at a temperature of 40° C. and the plating was carried out with a cathodic current density of 25 A/dm$^2$ for 2 minutes. Next, the supporter was laminated with the prepreg under the same conditions as the first embodiment. Then, the laminated board was checked for peeling strength of the supporter, the presence of exfoliation of the copper-nickel compound metal layer around the drilled holes and for soft etching with respect to the compound metal layer.

The appraisal is shown in Table 1.

Third To Thirteenth Embodiments

Electrolytic copper foils for a printed wiring board were utilized. The copper foils had a thickness of 18 μm, 35 μm and 70 μm, respectively and provided with a rough surface on a side of each thereof. The rough side of each of the foils were immersed in sulfuric acid of 3 weight % for 30 seconds at room temperature and then washed with water for 60 seconds. A parting layer, a copper-nickel compound metal layer and a thin copper foil layer were applied to each of the electrolytic copper foils to obtain a thin copper layer with a supporter, respectively. Each of the copper layers with the supporter was laminated with a prepreg under the same conditions as the first embodiment and then each of the laminated boards were respectively checked with for peel strength of the supporter, the presence of exfoliation of the copper-nickel compound metal layer around the drilled holes and tendency of soft etching with respect to the compound metal layer.

The appraisals are shown in Table 1.

It is clear from the above mentioned results that a suitable and stable peel strength of the supporter is obtained at all times by utilizing the copper foil supporter having rough surfaces and interposing the copper-nickel compound metal layer between the parting layer and the thin copper foil layer, thereby inhibiting peeling of the supporter away from the laminated board.

TABLE 1

| | Supporter | | Parting layer | | Cu—Ni Compound Metal Layer | | |
|---|---|---|---|---|---|---|---|
| | | | Concentra- | Conditions | Composition of Com. Metal Plating Liquid | | |
| | Thick- | Roughness of | tion of Chro- | of Treat- | Copper Sulfate | Nickel Sulfate | |
| | ness | Rough Surface *1 | mate Bath | ment *2 | ($5H_2O$) | ($6H_2O$) | Citric Acid |

TABLE 1-continued

|  | μm | μm | g/l | pH | mole/l | | |
|---|---|---|---|---|---|---|---|
| Embodiments | | | | | | | |
| 1 | 70 | 5.0 | Na$_2$Cr$_2$O$_7$: 20 | 4.1 | 0.08 | 0.16 | 0.5 |
| 2 | " | 1.0 | CrO$_3$: 1  K$_2$Cr$_2$O$_7$: 3 | 2.2 | 0.04 | 0.15 | 0.4 |
| 3 | " | 10.0 | K$_2$Cr$_2$O$_7$: 20 | 4.2 | 0.08 | 0.16 | 0.5 |
| 4 | 18 | 2.0 | CrO$_3$: 10 | 6.4 *5 | 0.12 | 0.24 | " |
| 5 | 35 | 4.0 | Na$_2$Cr$_2$O$_7$: 20 | 4.1 | 0.08 | 0.18 | " |
| 6 | 70 | 7.0 | " | " | " | " | " |
| 7 | 100 | 10.0 | " | " | " | " | " |
| 8 | 70 | 5.0 | " | " | 0.04 | 0.24 | 0.4 |
| 9 | " | " | " | " | 0.12 | 0.07 | 0.3 |
| 10 | " | " | " | " | 0.08 | 0.16 | 0.5 |
| 11 | " | " | " | " | " | " | " |
| 12 | " | " | " | " | " | " | " |
| 13 | " | " | " | " | " | " | " |
| Comparative Exam. | | | | | | | |
| 1 | 70 | Luster Surface (0.2 μm) | | Cr Plating Layer (0.06 μm) | | | |
| 2 | 70 | Rough Surface (0.5 μm) | | Cr Plating Layer (1.0 μm) | | | |

| | Cu—Ni Compound Metal Layer Conditions of Plating | | | Cu Foil Layer | | Appraisal | | |
|---|---|---|---|---|---|---|---|---|
| | | Time of Plating | Thickness | Composition of Com. Metal | Plating | Thickness | Peel Strength | Damage of Copper Foil Around Drilled | Capability of Soft Etching of Com. Metal |
| | pH | Minutes | μm | wt % Cu | Bath | μm | g/cm | Holes | Layer *4 |
| Embodiments | | | | | | | | | |
| 1 | 5.2 | 4.0 | 1.0 | 75 | Copper Pyrophosphate *# | 5.0 | 60 | None | Good |
| 2 | 5.5 | " | " | 35 | Copper Sulfate | " | 35 | None | Good |
| 3 | 5.2 | " | " | 75 | Above # | " | 100 | None | Good |
| 4 | " | 0.4 | 0.1 | " | " | " | 40 | None | Good |
| 5 | " | 4.0 | 1.0 | " | " | " | 55 | None | Good |
| 6 | " | " | " | " | " | " | 80 | None | Good |
| 7 | " | " | " | " | " | " | 115 | None | Good |
| 8 | " | " | " | 13 | " | " | 65 | None | Good |
| 9 | 5.4 | " | " | 86 | " | " | 63 | None | Good |
| 10 | 5.2 | 24.0 | 6.0 | 75 | " | " | 68 | None | Good |
| 11 | " | 4.0 | 1.0 | " | " | " | 65 | None | Good |
| 12 | " | " | " | " | " | 1.0 | 61 | None | Good |
| 13 | " | " | " | " | " | 1.9 | 64 | None | Good |
| Comparative Exam. | | | | | | | | | |
| 1 | | | | | " | 5.0 | 150~500 | Damage found | — |
| 2 | | | | | " | " | 2 | — | — |

*1 Value showing a difference between the absolute top and bottom.
*2 Bath temperature constant at 25° C. Immersing time constant for 60 seconds.
*3 Bath temperature constant at 40° C. Current density constant at 3 A/dm$^2$.
*4 Checking if the compound metal layer is solved completely by immersing same in an aqueous solution including an ammonium persulfate of 100 g/l. When solved, its appraisal is good.
*5 The pH is controlled with a caustic soda.

Comparative Example 1

As a supporter, a rolled luster copper foil, which had a rough surface having a roughness difference of 0.2 μm between the absolute top and bottom of the rough, was immersed in a sulfuric acid of 5 weight % at a temperature of 25° C. for 60 seconds and washed with water for 30 seconds. Then, a side of the copper foil was immersed in a plating bath as identified below and subjected to cathodic electrolysis to form a chrome plating of 0.06 μm on the side of the foil.

Chromium trioxide: 350 g/l
Sulfuric acid: 3.5 g/l
Bath temperature: 27° C.
Cathodic current density: 11.0 A/dm$^2$
Immersing time: 30 seconds
Anode: Lead After the chrome deposited supporter was washed with water for 60 seconds, a thin copper foil layer of 5.0 μm in thickness was formed thereon by using a plating bath of copper pyrophosphate and the same plating conditions as the first embodiment. Thereafter, the thin copper foil layer with the supporter was immediately washed with water for 30 seconds and dried by a hot air dryer. The thin copper foil with the supporter was laminated with a prepreg under high pressure and high temperature (at 165° C. under 50 kg/cm$^2$ for 60 seconds) and holes formed using a drill having a diameter of 1 mm after which the supporter was peeled off. The peel strength of the supporter varied widely from 150 to 500 g/cm. A part of the thin copper foil layer around the drilled holes was damaged by the supporter which was peeled off.

Comparative Example 2

A copper foil having a thickness of 70 μm and rough surfaces having a roughness of 5 μm was used as a supporter. The rough surface of the copper foil was pickled, washed with water and deposited with chrome in the same manner as the comparative example 1. The immersing time was controlled to obtain 1 μm thick chrome plating. The chrome deposited supporter was washed with water for 45 seconds and a thin copper foil layer having a thickness of 5 μm was formed using a plating bath of copper pyrophosphate which was the same as the first embodiment. Thereafter, it was washed with water for 30 seconds and dried. Then, the thin copper foil layer with the supporter was laminated with a prepreg (NEMA grade FR-4) under high pressure and temperature (at 165° C. under 50 kg/cm$^2$ for 60 seconds) in such a manner that the thin copper foil layer faced the prepreg. While the laminated board was taken out from a press machine, swelling of the copper foil supporter was found having diameter of 1 to 2 cm on the surface of the laminated board. When the laminated board was cut to a required size, the copper foil supporter was peeled off from the board and it became difficult to drill in the next step. The peel strength of the supporter was measured to be 2 g/cm.

Through the first and second embodiments as well as the comparative examples 1 to 13, the following facts should be noted.

As the thin copper foil for the printed wiring board:

Through the test and checking of the peel strength of the supporter, it is found that there is no particular problem in the course of processes necessary for a printed wiring board in the event that the peel strength belongs to a range of 20~200 g/cm with a test of peeling at 90 degrees.

Where the peel strength is less than 20 g/cm, it will be dangerous that the copper foil supporter is peeled off while laminating the prepreg and the thin copper foil with the supporter under high pressure and temperature or while drilling the thin copper foil. Further, it is found that it is preferable not to exceed a peel strength of 200 g/cm, since great force is necessary to peel off the copper foil supporter particularly in a case that the laminated board is prepared in large scale and it becomes sometimes dangerous that the thin copper foil layer is damaged or broken around the drilled holes.

On the basis of the tests described above, the inventors have checked the influence of a shape of the rough surface of the copper foil supporter on the peel strength of the supporter. As the results, it has been found that a surface roughness of the rough surface in a range of 1~10 μm between the absolute top and bottom of the rough surface is preferred. However, it is perferable not to have a roughness of less than 1 μm, because the peel strength between the parting layer and the copper-nickel compound metal layer sometimes becomes less than 20 g/cm. If the surface roughness exceeds 10 μm, the peel strength can exceed 200 g/cm.

The thickness of the copper foil supporter is preferably in the range of 18 μm to 100 μm, with a nominal value of 70 μm. It is preferable to have a thickness of the copper foil supporter greater than 18 μm, since creases occur with a thinner copper foil supporter even if the copper-nickel compound metal layer has a thickness of 6.0 μm and the thin copper foil layer has a thickness of 9.0 μm, both laminated together via a parting layer by means of a plating process.

Conversely, it is preferable in such a case that the thickness of the copper foil supporter not exceed 100 μm, since the peel strength of the supporter sometimes exceeds 200 g/cm due to rigidity of the copper foil per se.

It is perferable that the parting layer formed on the rough surface of the copper foil supporter is a chrome compound obtained by means of a chromate treatment. As the parting layer, it may be possible to form another parting layer in such a manner that copper oxides, copper sulfide, silver iodide or the like is formed on the copper foil supporter and then a thin copper foil layer is deposited on the parting layer by means of an electric plating process. However, such a manner has to be carried out very carefully in forming the parting layer in order to stabilize the peel strength of the supporter. The parting layer according to the present invention has a characteristic in stabilizing the peel strength of the supporter in such a manner that the copper-nickel compound metal layer is interposed between the thin copper foil layer and the chromate compounds which are obtained by means of a chromate treatment.

Further, it is preferable that the thickness of the compound metal layer is between 0.01 μm and 6.0 μm. It is preferable that the thickness not be is less than 0.01 μm, since it causes occurrence of pinholes as the compound metal layer cannot cover the parting layer completely.

The maximum thickness of the compound metal layer is determined according to a dissolving speed in a soft etching process. Normally, according to the conditions used by the manufacturers in the field of printed wiring boards, the amount dissolved is 6.0 μm per 3 minutes of treatment at maximum. Therefore, it is preferable to control the maximum thickness of the compound metal layer to be less than 6.0 μm.

The compound metal layer has to be dissolved and removed in a soft etching process for the printed wiring board. A soft etching liquid normally used is an etching liquid which includes at least one of the following: sulfuric acid - hydrogen peroxide, persulfates, ferric chloride, cupric chloride or ammonia double salts.

The copper-nickel compound metal layer may be dissolved in general soft etching liquids. It is more preferable that the composition of the copper-nickel compound metal layer includes a copper in a range of 10 to 90 weight %, and is preferable that the copper is not less than 10 weight % since it takes excessive time to carry out soft etching. Further, it is preferable to use the copper-nickel compound metal layer in which a copper not exceed 90 weight % since the peel strength of the supporter sometimes becomes less than 20 g/cm.

The thickness of the thin copper foil layer, which is formed on the copper-nickel compound layer, is preferably within the range of 1~9 μm. In a soft etching process, the copper-nickel compound layer which is located at the extreme top surface should be completely removed whereby the thin copper foil layer, which is an underlayer, is exposed. It is preferable that the thickness of the thin copper foil layer not be less than 1 μm, since there is a danger of dissolving and removing the thin copper foil layer with an excessive etching. The thickness of the thin copper foil layer as mentioned before includes the rough surface, though there is a case that the rough surface is formed with the thin copper foil layer in order to improve a bonding strength to the prepreg.

As the method of manufacturing the microscopic thin copper foil for a printed wiring board:

As a method of roughening the copper foil supporter, the following steps are included.

① A chemical etching process in which a copper foil is immersed in an aqueous solution including ammonium persulfate of 20~100 g/l for 20~100 seconds by keeping a temperature of its bath at 30°~50° C.

② A mechanical grinding in which a copper foil is ground by a file.

③ A plating process in which a copper foil is plated in a copper plating bath including copper sulfate (5H$_2$O) of 100~50 g/l, sulfuric acid of 50~80 g/l, nitric acid of 10~50 g/l, with a cathodic current density of 18~32 A/dm$^2$, at a bath temperature of 35°~50° C. for an electrolytic time of 60~180 seconds.

⑤ A manner of utilizing a copper foil for electrolysis having a rough surface on a side thereof, which copper foil is well known in the art of this field as a copper foil for a printed wiring board.

It is perferable to form the parting layer by immersing the rough surface of the copper foil supporter in a chromate bath which includes hexavalent chromium ions and keeps its pH at 2.0~6.5.

The pH of the chromate bath influences the peel strength of the supporter. When the pH is less than 2.0 or exceeds 6.5, it is difficult to form the parting layer and therefore it is difficult to peel off the copper foil supporter from the board. When the pH is within a range of 2.0~6.5, the peel strength becomes extremely stable. Sulfuric acid or caustic soda may be used for controlling the pH.

As hexavalent chromium ions, it may use at least one selected from a chromium oxide, potassium dichromate or sodium dichromate. It is preferable to use a chromate bath including 0.1 g/l of hexavalent chromium ions. There is a disadvantage if a concentration of the hexavalent chromium ions is less than 0.1 g/l, since the peel strength of the supporter is increased. There is no effect on the peel strength of the supporter even if the concentration of the hexavalent chromium ions becomes too high, but increased costs are associated with dealing with the waste fluid of the chromate bath. Preferably, the concentration of the hexavalent chromium ions is within a range of 5~20/l.

As the compound metal layer, it is preferable to use a copper-nickel compound metal layer which may be obtained by immersing the parting layer in a plating bath of compound metal which includes cupric ions and nickel ions and keeps its pH more than 5.0, and by giving thereto a cathodic electrolysis.

As the plating bath of compound metal, it is preferable to use such a bath which includes copper sulfate (5H$_2$O) of 0.04~0.12 mole/l as cupric ions, nickel sulfate (6H$_2$O) of 0.07~0.12 mole/l as nickel ions, and citric acid of 0.3~0.5 mole/l.

When the pH of the plating bath of compound metal is less than 5.0, the parting layer given onto the rough surface of the copper foil supporter is broken and a peeling effect may be reduced and as the result it becomes hard to peel off the copper foil supporter. When the pH is more than 5.0, the peel strength of the supporter always indicates a stable value.

To add a citric acid to the plating bath of the compound metal is to prepare a chelate compound combining a cupric ion and a nickel ion. However, while there are chemicals to prepare a chelate, it is found that when the citric acid is used, it may deposit a compound metal coat like a plating which coat has little pinholes. Where a chelate such as a citric acid is not added, only a copper is deposited with priority and it does not form a copper-nickel compound coat or deposit a porous compound metal layer in the state of powders.

Next, the copper-nickel compound metal layer is immersed in a copper electric plating bath and a thin copper foil layer having a thickness of 1~9 μm is deposited by means of cathodic electrolysis.

The electric copper plating bath referred to herein indicates a plating bath of cupric pyrophosphate, a plating bath of copper sulfate, a plating bath of copper cyanide, copper fluoride and any one of those baths may be used.

Further, it is preferable to deposit copper in the state of dendrite on the surface of the thin copper foil layer in order to improve the bonding strength of the thin copper foil layer to the prepreg.

What is claimed is:

1. A method of manufacturing a thin copper foil for a printed wiring board comprising the steps of:
   (a) preparing a copper foil supporter having a rough surface on at least a side thereof,
   (b) forming a parting layer on the rough surface of the copper foil supporter by immersing the rough surface in a chromate bath including hexavalent chromium ions and keeping a value of pH between 2.0 and 6.5,
   (c) forming a copper-nickel compound metal layer by immersing the parting layer in a compound metal plating bath including cupric ions, nickel ions and citric acid and keeping a value of pH more than 5.0 and by plating same by means of cathodic electrolysis, and
   (d) immersing the copper-nickel compound metal layer in an electric plating bath to deposit a thin copper foil layer.

2. A method of manufacturing a thin copper foil for a printed wiring board comprising the steps of:
   (a) preparing a copper foil supporter having a rough surface on at least a side thereof, said rough surface being provided with a difference of 1~10 μm between the absolute top and bottom thereof and a thickness of 18~100 μm,
   (b) forming a parting layer on the rough surface of the copper foil supporter by immersing the rough surface in a chromate bath keeping a value of pH between 2.0~6.5 and including at least one kind of chromate compounds selected from a group of chromium trioxide, potassium dichromate and sodium dichromate at a concentration of 0.1 g/l as hexavalent chromium ions.
   (c) forming a copper-nickel compound metal layer having a thickness of 0.01~0.6 μm by immersing the parting layer in a compound metal plating bath including copper sulfate (5H$_2$O) of 0.04~0.12 mole/l nickel sulfate (6H$_2$O) of 0.07~0.24 mole/l and citric acid of 0.3~0.5 mole/l and keeping a value of pH more than 5.0, and by depositing the parting layer by means of cathodic electrolysis, and
   (d) immersing the copper-nickel compound metal layer in an electric copper plating bath to deposit a thin copper foil layer having a thickness of 1~9 μm.

* * * * *